US012730065B2

(12) United States Patent
Utsugi et al.

(10) Patent No.: US 12,730,065 B2
(45) Date of Patent: Sep. 8, 2026

(54) DEFECT INSPECTION DEVICE

(71) Applicant: Hitachi High-Tech Corporation, Tokyo (JP)

(72) Inventors: Takeru Utsugi, Tokyo (JP); Toshifumi Honda, Tokyo (JP); Kenshiro Ohtsubo, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 141 days.

(21) Appl. No.: 18/571,624

(22) PCT Filed: Jul. 14, 2021

(86) PCT No.: PCT/JP2021/026515
§ 371 (c)(1),
(2) Date: Dec. 18, 2023

(87) PCT Pub. No.: WO2023/286220
PCT Pub. Date: Jan. 19, 2023

(65) Prior Publication Data

US 2024/0280483 A1 Aug. 22, 2024

(51) Int. Cl.
*G01N 21/45* (2006.01)
*G01N 21/88* (2006.01)
(Continued)

(52) U.S. Cl.
CPC ......... *G01N 21/45* (2013.01); *G01N 21/8806* (2013.01); *G01N 21/9501* (2013.01);
(Continued)

(58) Field of Classification Search
CPC ............... G01N 21/45; G01N 21/8806; G01N 21/9501; G01N 2021/8848; G01N 2201/121; H01L 22/00
See application file for complete search history.

(56) References Cited

U.S. PATENT DOCUMENTS 9,865,047 B1 * 1/2018 Chen .................... G01B 11/306
2004/0218262 A1 * 11/2004 Chuang .................. G02B 21/02 359/366
(Continued)

FOREIGN PATENT DOCUMENTS

JP 2002277399 A * 9/2002 ............ G01N 21/84
JP 2013-164281 A 8/2013
(Continued)

OTHER PUBLICATIONS

JP2013164281A English translation (Year: 2013).*
(Continued)

*Primary Examiner* — Tarifur R Chowdhury
*Assistant Examiner* — Kaitlyn E Kidwell
(74) *Attorney, Agent, or Firm* — Foley & Lardner LLP

(57) ABSTRACT

Provided is a technique capable of reducing an influence of an inter-beam phase difference unrelated to a defect and accurately detecting even a defect having a low aspect ratio by a defect inspection device using differential interference contrast. To achieve the above purpose, provided is the defect inspection device using differential interference contrast that inspects a specimen using light. The defect inspection device includes: a light source configured to emit a light beam; a polarized light separation element configured to split the light beam into a first beam and a second beam which are polarized and orthogonal to each other; a sensor configured to detect a signal from the first beam and the second beam reflected from the specimen; and a processing processor configured to process the signal detected by the sensor. The processing processor uses a signal string obtained based on information around a measured point to be measured on the specimen to correct a measured signal at the measured point.

15 Claims, 13 Drawing Sheets

(51) Int. Cl.
*G01N 21/95* (2006.01)
*H10P 74/00* (2026.01)

(52) U.S. Cl.
CPC ...... *H10P 74/00* (2026.01); *G01N 2021/8848* (2013.01); *G01N 2201/121* (2013.01)

(56) References Cited

U.S. PATENT DOCUMENTS

| | | | | |
|---|---|---|---|---|
| 2010/0195873 | A1* | 8/2010 | Cui | G02B 21/367 382/106 |
| 2013/0301042 | A1* | 11/2013 | Urano | G01N 21/956 356/237.5 |
| 2015/0116702 | A1* | 4/2015 | Matsumoto | G01T 1/2018 356/237.5 |
| 2016/0025645 | A1 | 1/2016 | Huang et al. | |

FOREIGN PATENT DOCUMENTS

| | | | |
|---|---|---|---|
| JP | 2013-217703 | A | 10/2013 |
| JP | 2017-531162 | A | 10/2017 |
| WO | WO-2016/014590 | A1 | 1/2016 |
| WO | WO-2020/208680 | A1 | 10/2020 |

OTHER PUBLICATIONS

JP2013217703A English translation (Year: 2013).*
International Search Report with English Translation and Written Opinion of International Patent Application No. PCT/JP2021/026515 dated Sep. 21, 2021 (10 pages).

* cited by examiner

[FIG. 1]
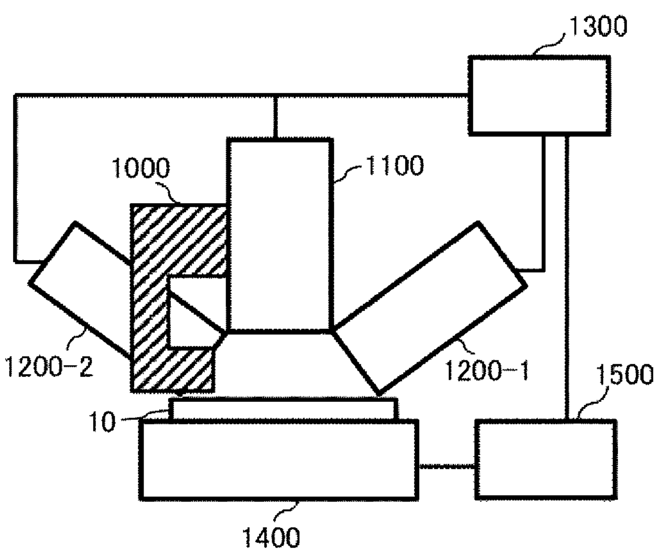
[FIG. 2]
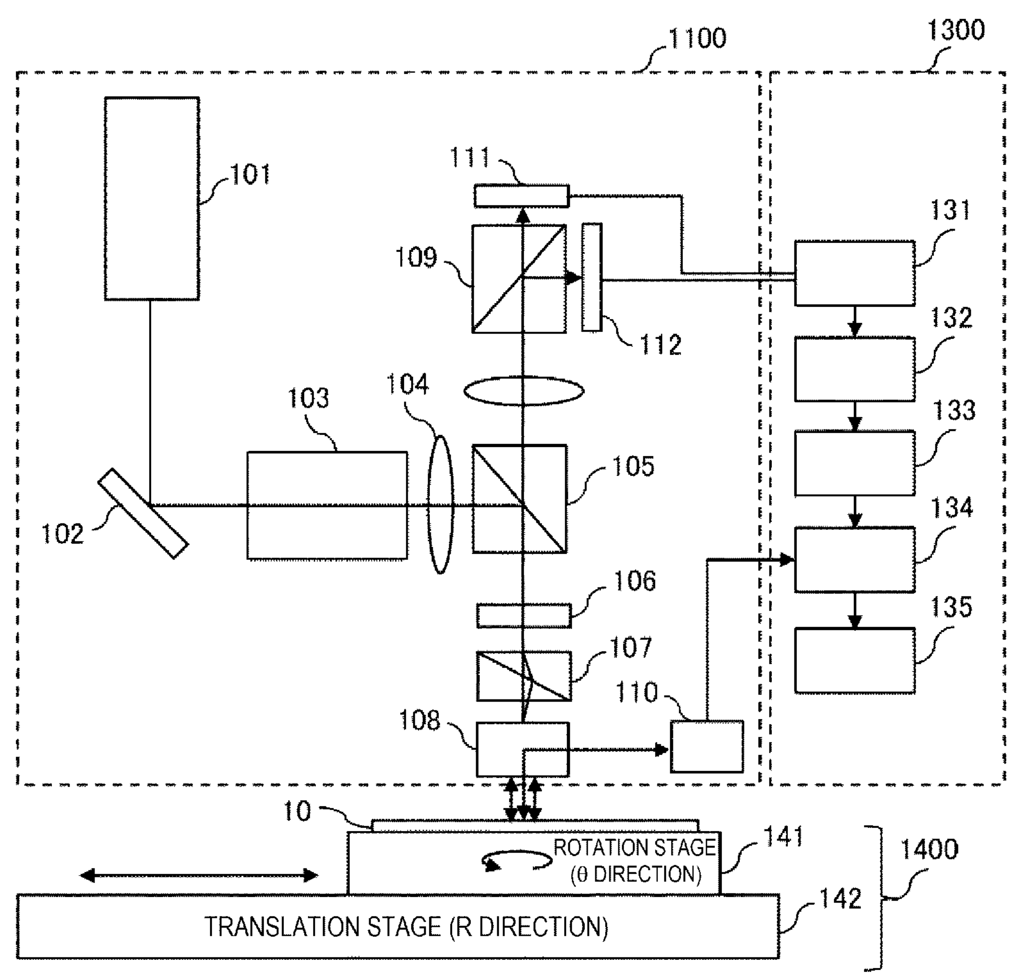

[FIG. 3]
(a)
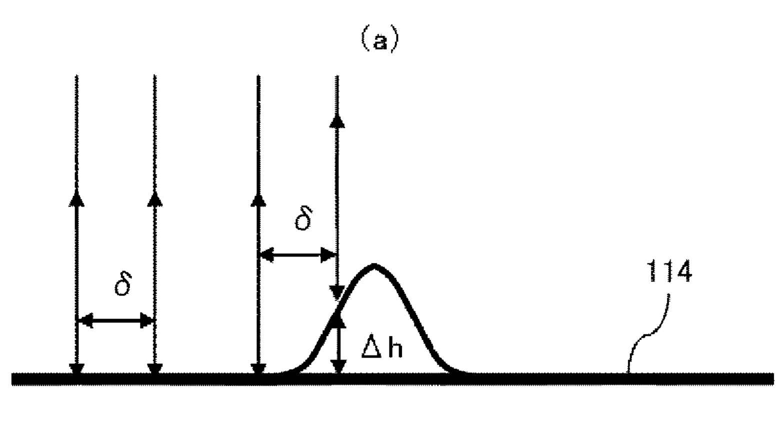
(b)
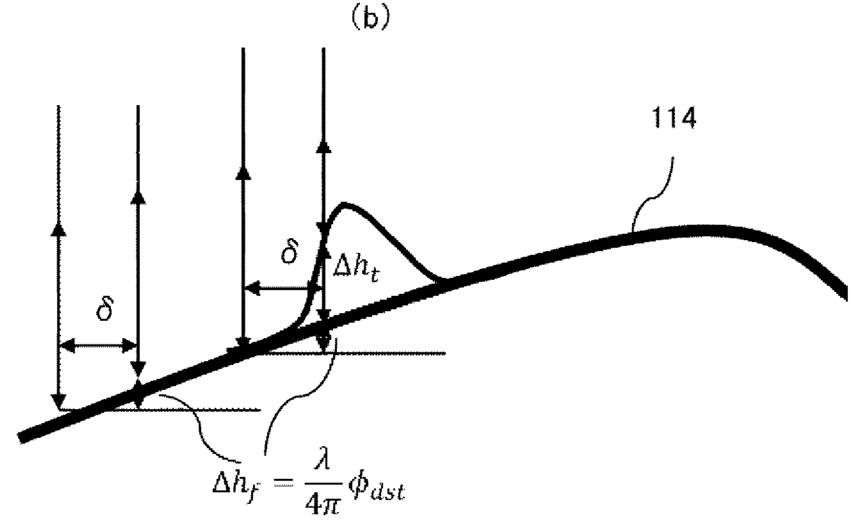

[FIG. 4]
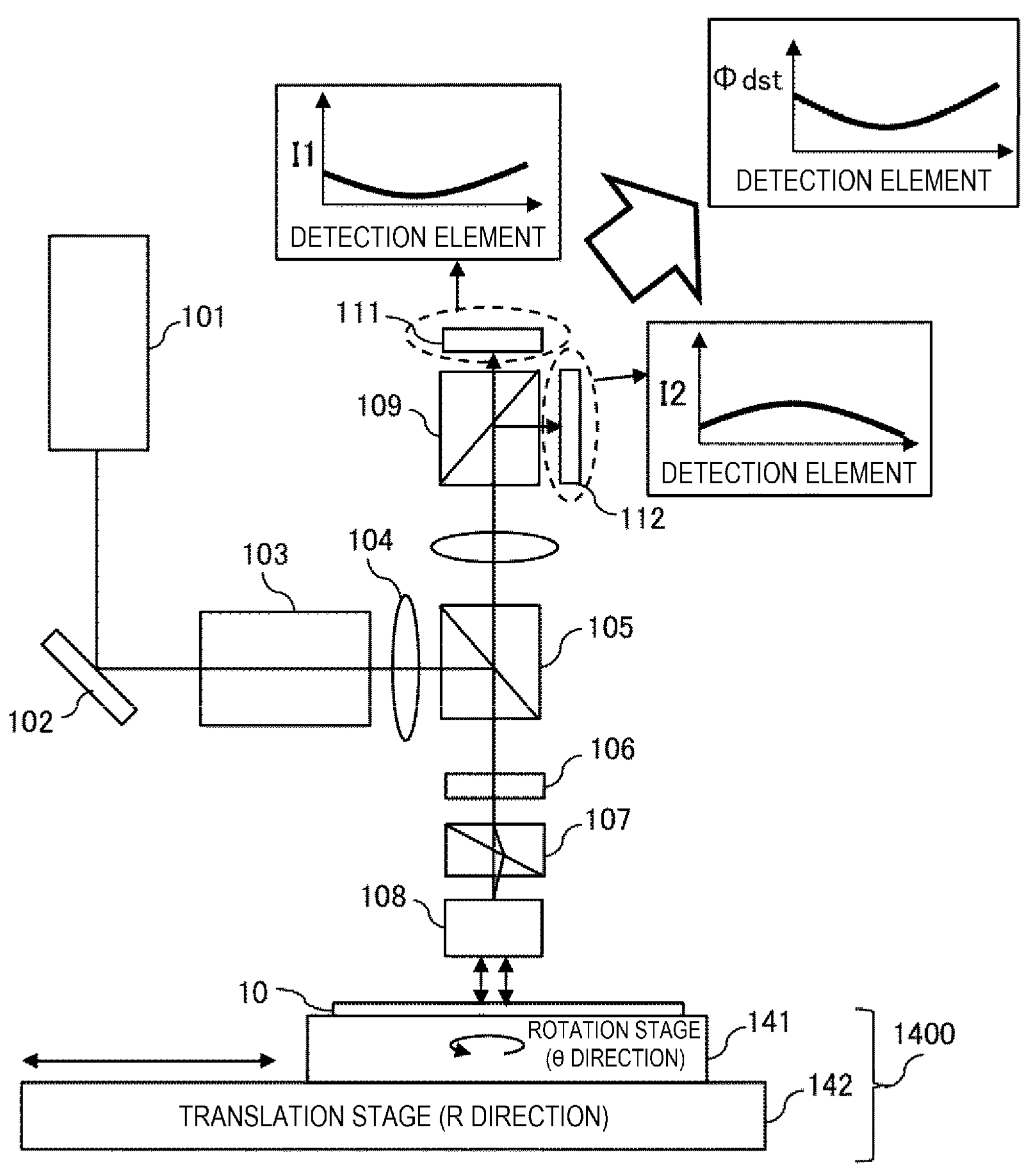

[FIG. 5]
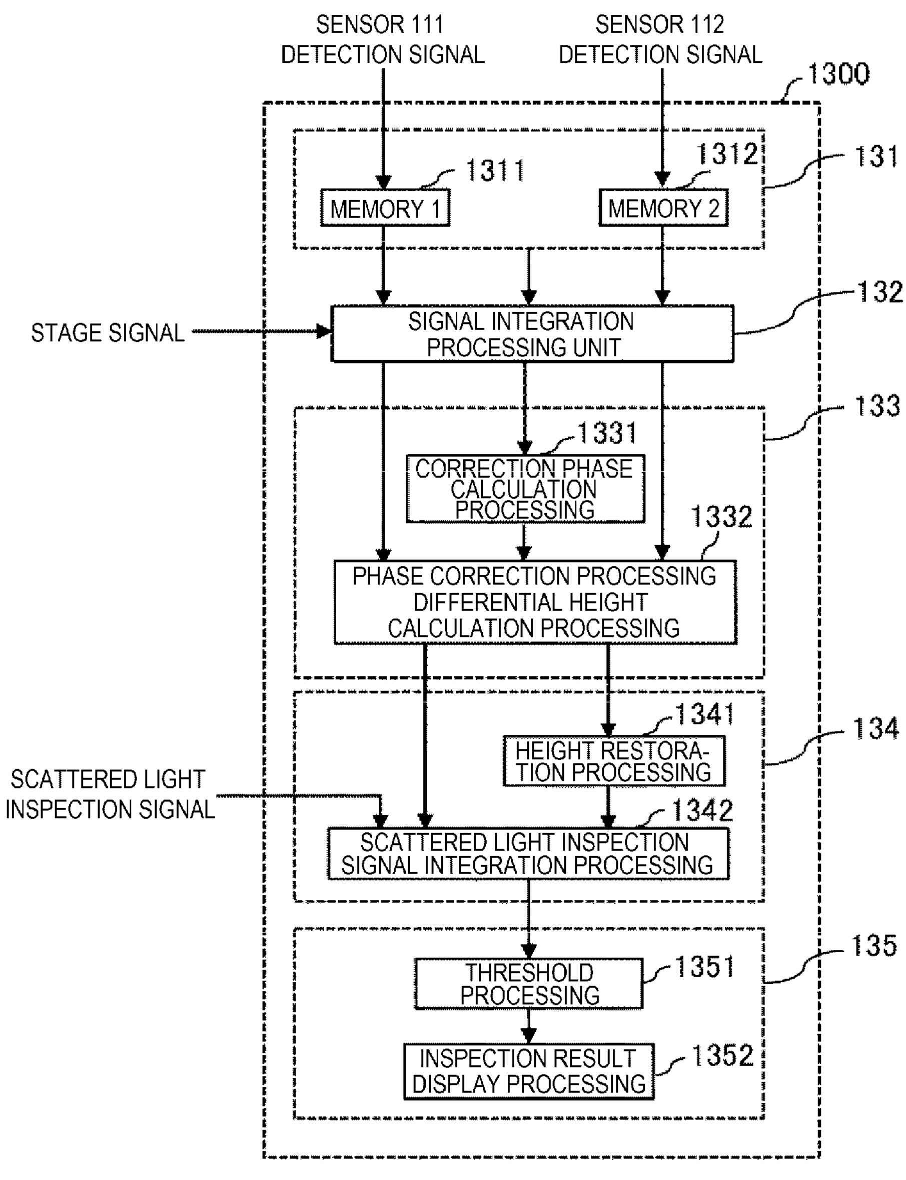

[FIG. 6]
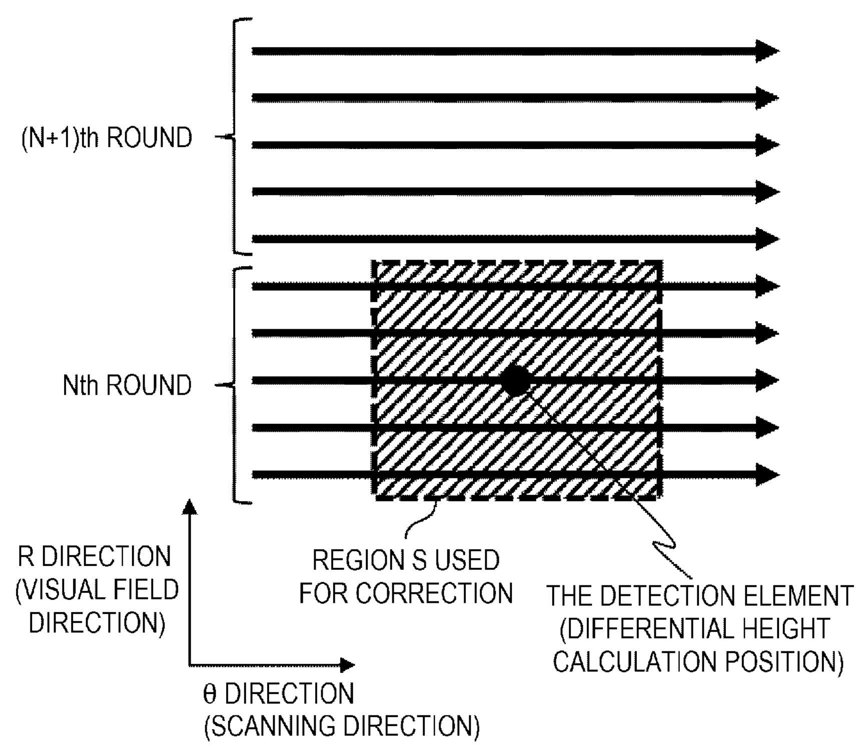

[FIG. 7]
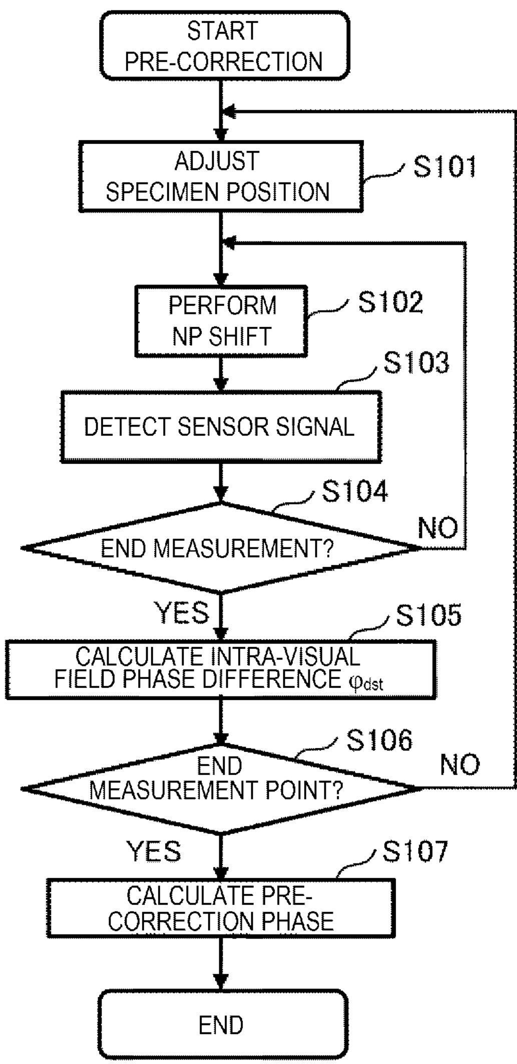

[FIG. 8]
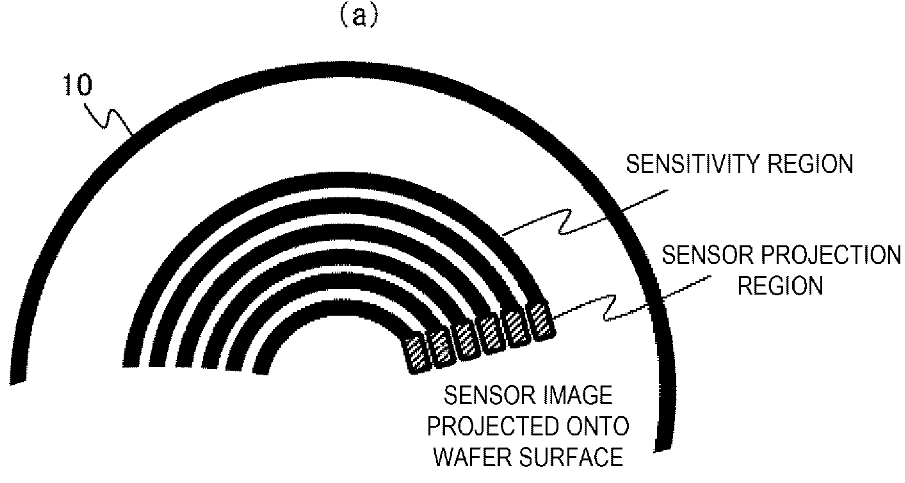
[FIG. 9]
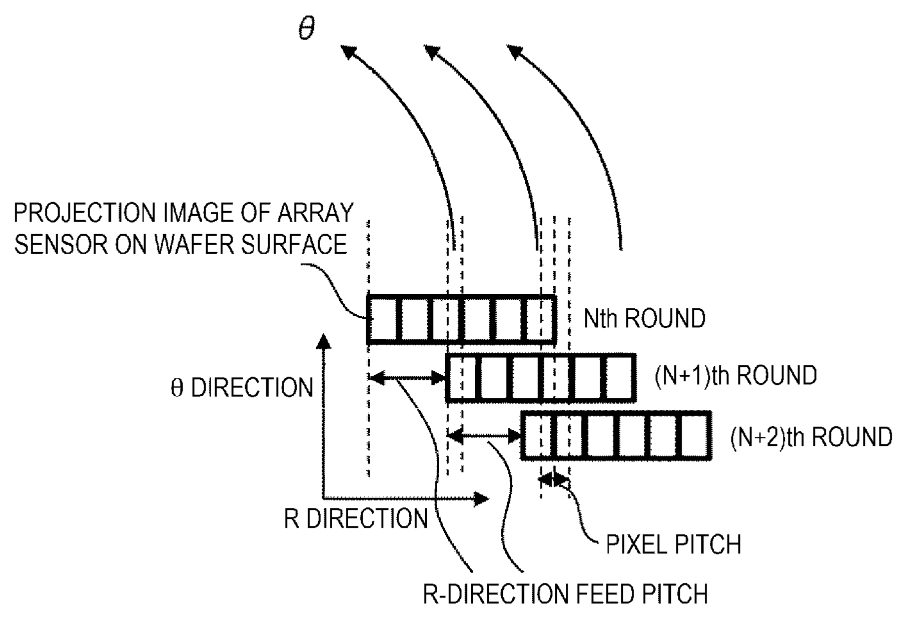

[FIG. 10]
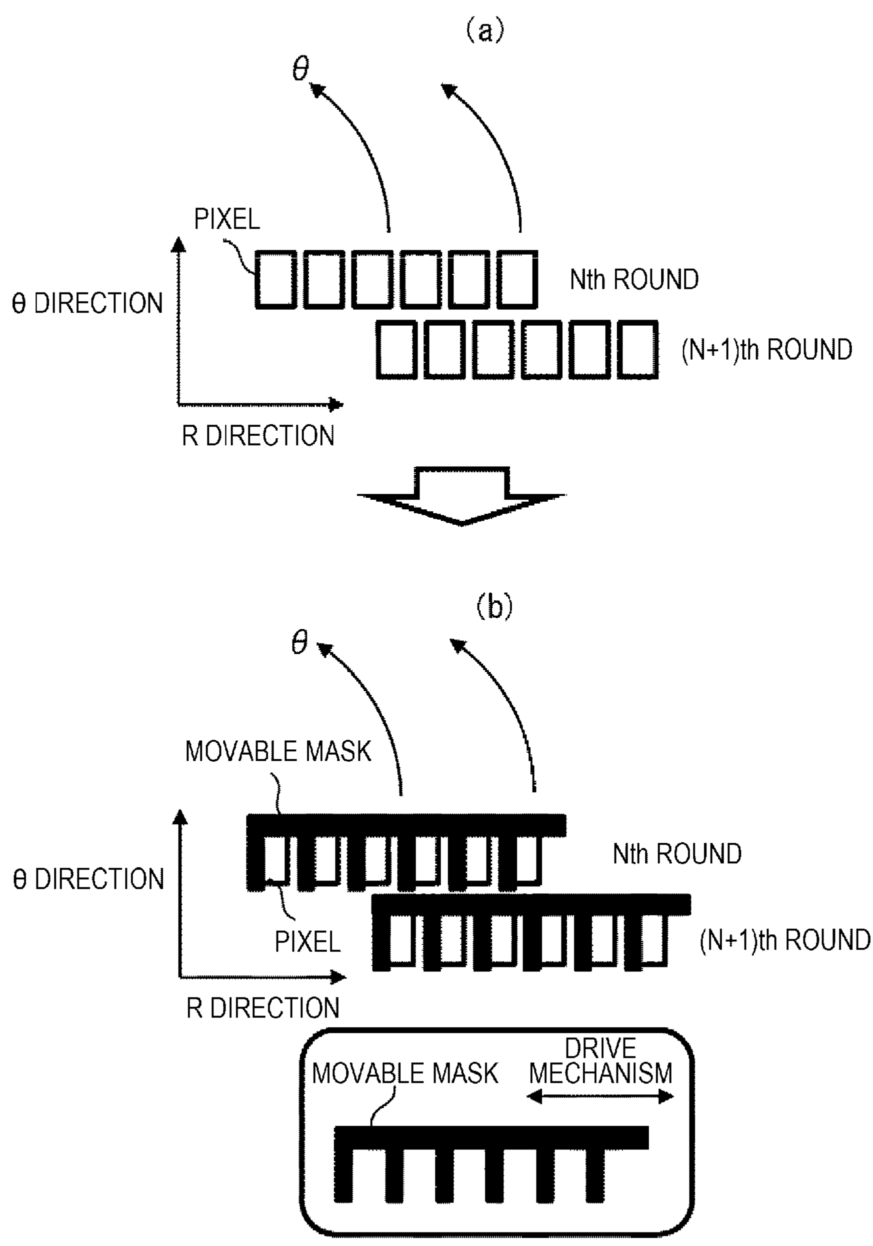

[FIG. 11]
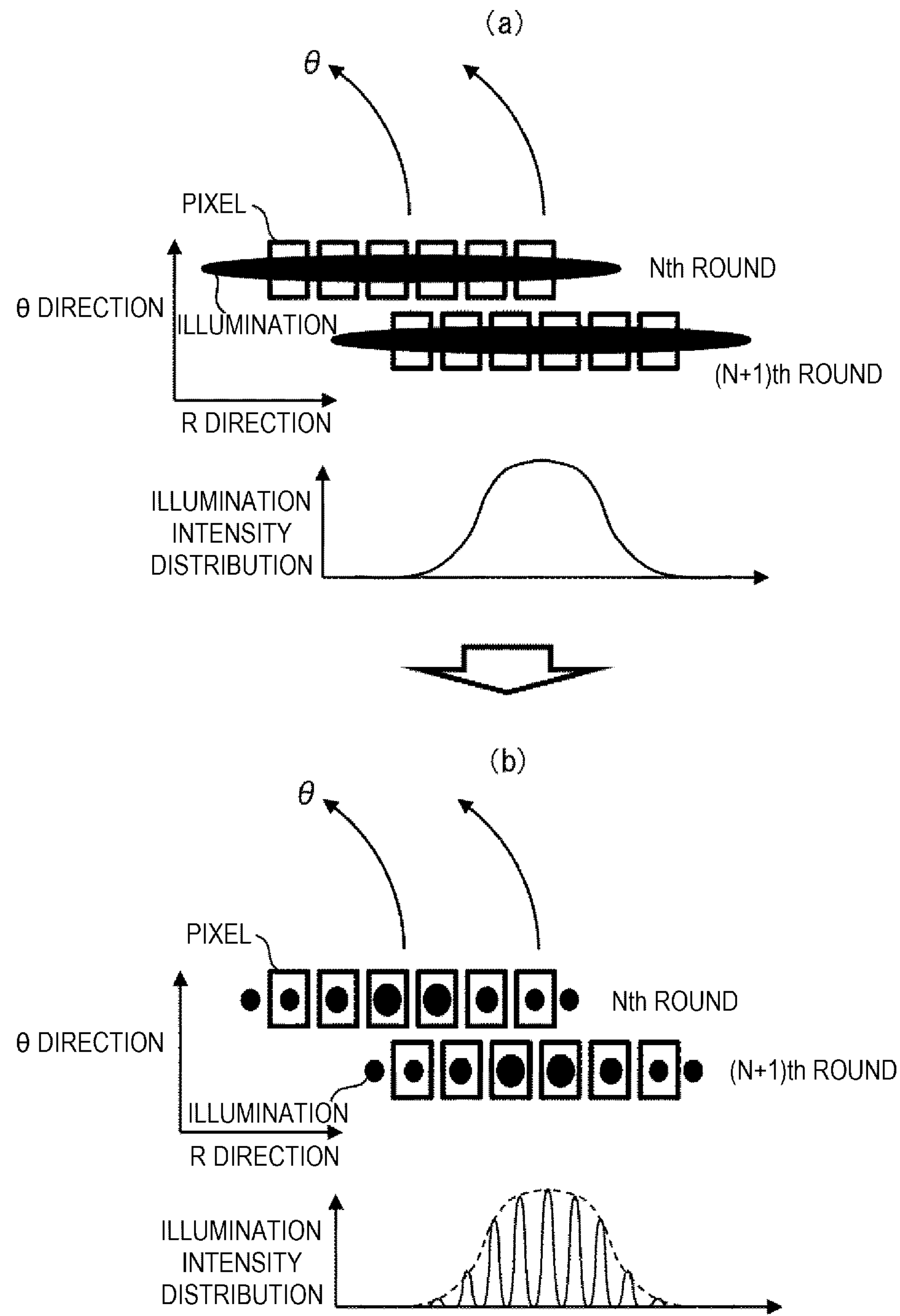

[FIG. 12]
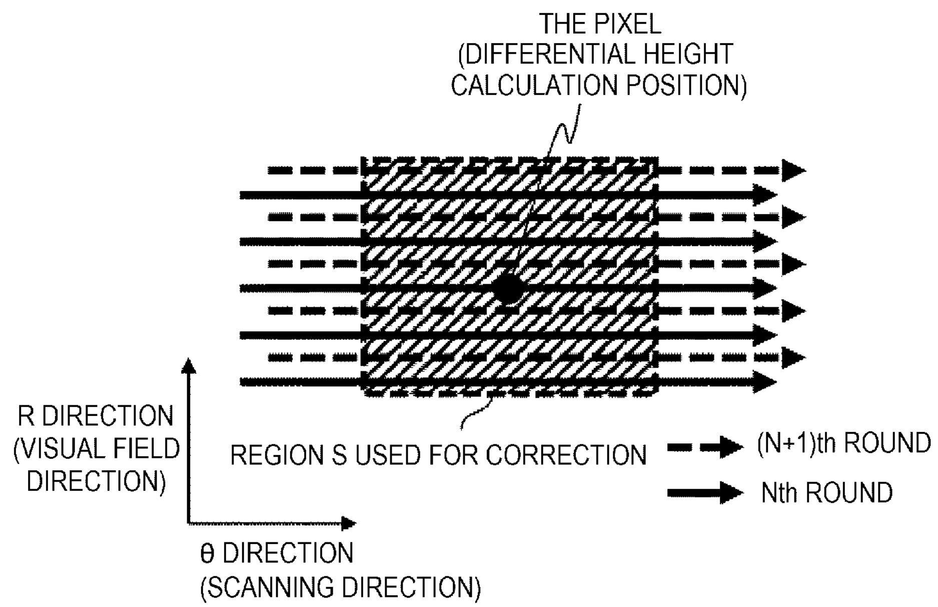

[FIG. 13]
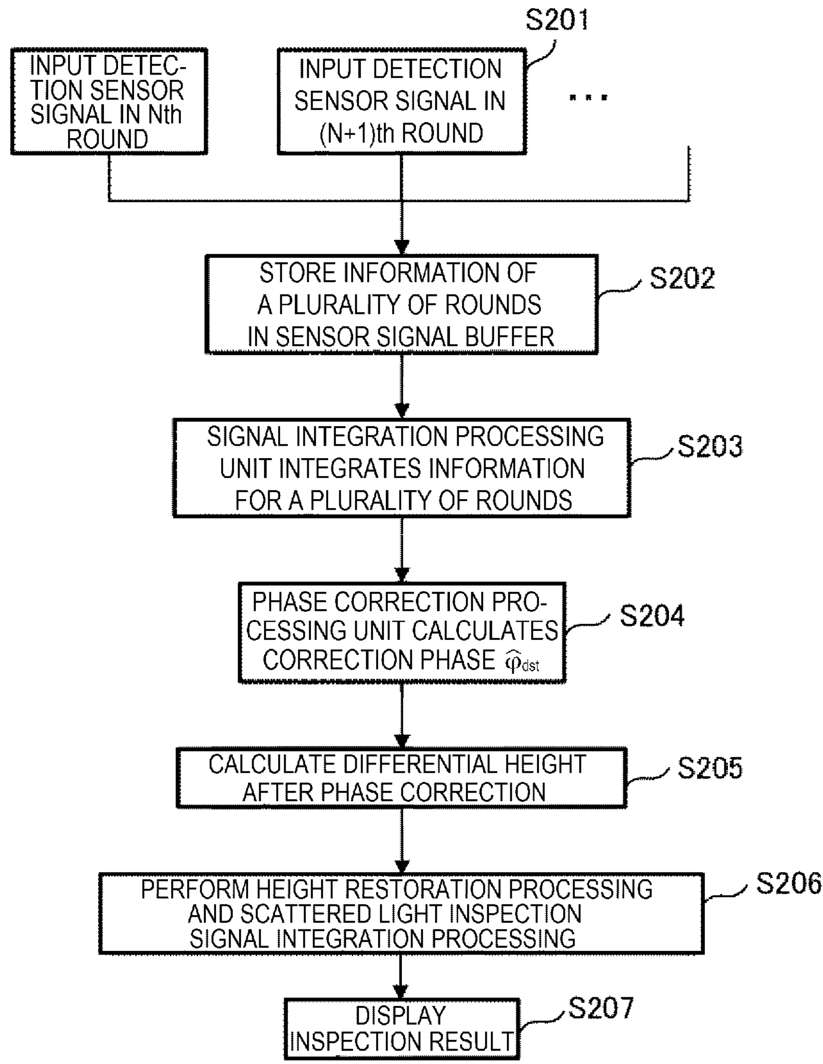

[FIG. 14]
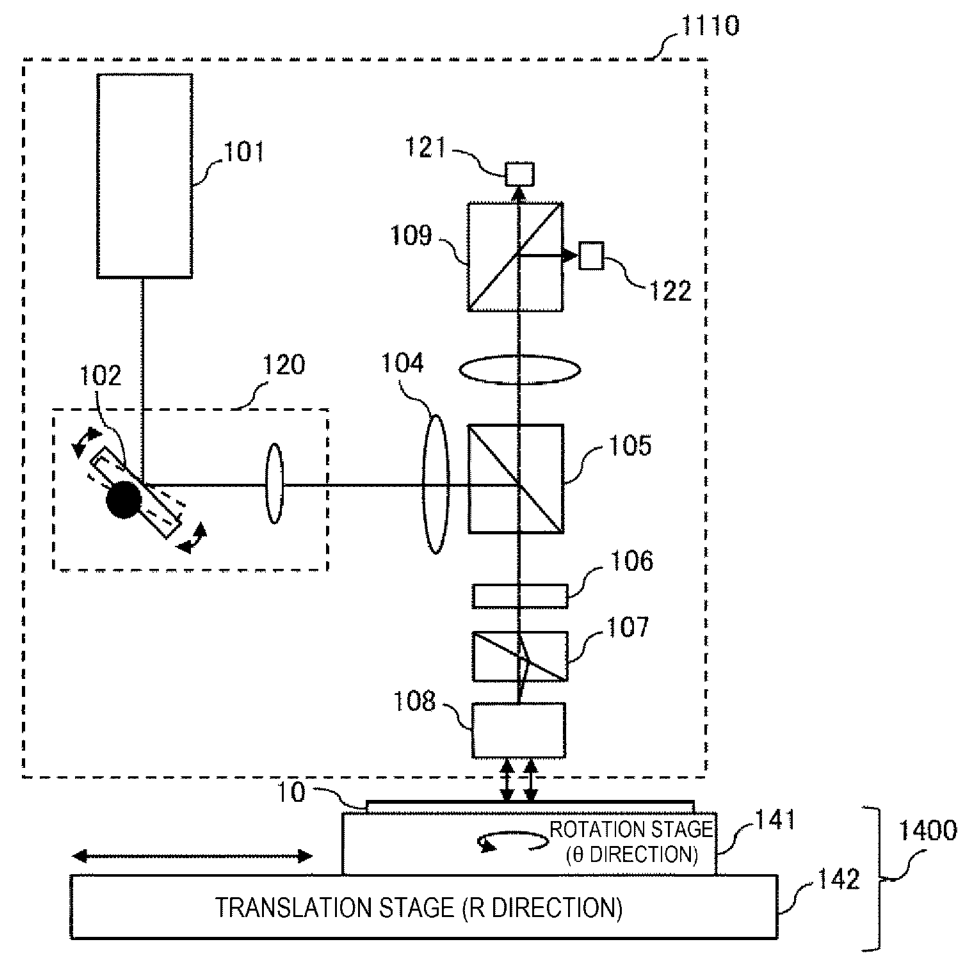
[FIG. 15]
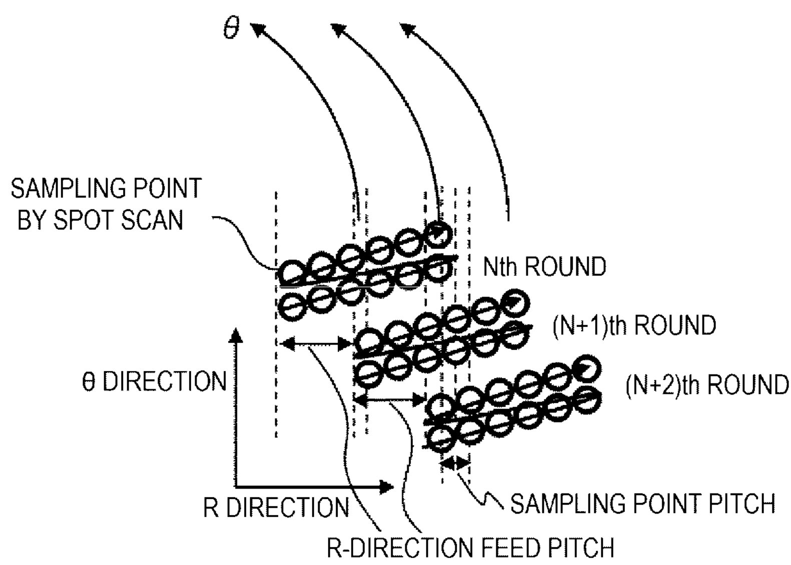

[FIG. 16]
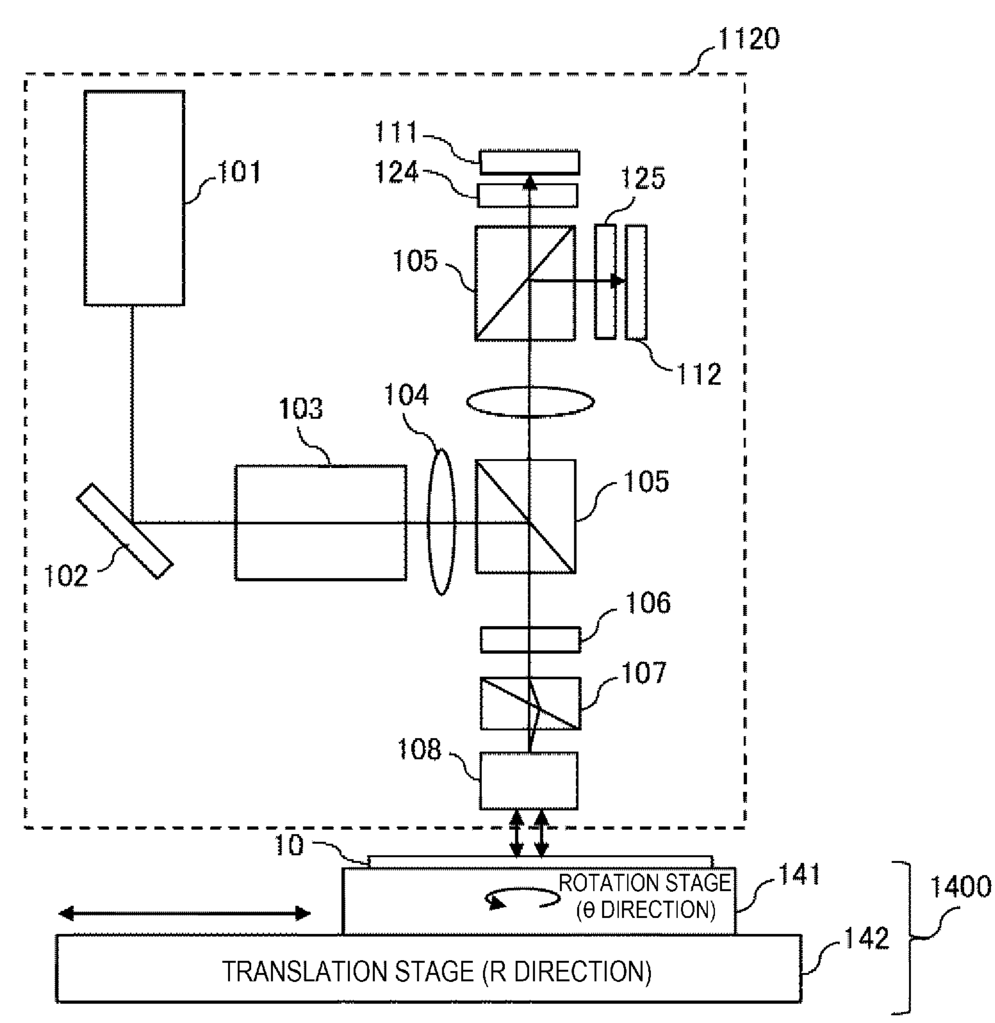

DEFECT INSPECTION DEVICE

TECHNICAL FIELD

The present invention relates to a defect inspection device using light for inspecting a semiconductor wafer or the like.

BACKGROUND ART

As miniaturization of a semiconductor device progresses, a surface state of a semiconductor wafer and a size or a shape of a defect on the wafer greatly affect performance and yield of the device. In addition, there are various types of defects depending on a difference in a process in which the defects are generated or the like. For example, it is necessary to inspect a fine granular defect (fine defect) of about 10 to several tens of nanometers or a very gentle low aspect ratio defect (low-stage defect) of about several nanometers in height and several to several tens of micrometers in width.

Scattering inspection that detects scattered light of a laser is useful for detection of a fine defect, and interference measurement such as differential interference contrast (DIC) inspection using a principle of a differential interference microscope is useful for detection of a low aspect ratio defect which is a low stage defect in which the scattered light is hardly generated. For example, PTL 1 discloses an optical system in which scattered light inspection and DIC inspection are simultaneously detected by scanning a wafer surface with laser light illumination.

CITATION LIST

Patent Literature

PTL 1: JP2017-531162A

SUMMARY OF INVENTION

Technical Problem

An inspection device described in PTL 1 discloses the DIC inspection in which defect inspection of an entire surface of a wafer is performed by irradiating a specimen with two beams and detecting a phase difference between the two beams. In the DIC inspection, the beams are separated into two orthogonal polarized light components (for example, a P-polarized light component and an S-polarized light component) by a birefringent element, and irradiated onto the specimen. An interval of these beams on a specimen surface is called a shear amount (δ). The specimen surface is scanned using the two beams, and reflected light from the specimen is recombined to obtain interference light. The shear amount is determined by an optical configuration. When flatness of the specimen is inspected using the two beams, unevenness can be inspected by extracting a phase shift between the two beams caused by the unevenness of the specimen surface from the interference light.

In the DIC inspection, a defect is inspected using the phase difference between the two beams that scan the specimen, and thus accurate defect detection becomes difficult when the phase difference occurs regardless of the defect. Examples of causes of phase difference detection unrelated to the defect include (a) an unintended inclination and strain of the specimen, (b) an unintended phase difference caused by the optical system, and (c) an irregular variation in light source power and specimen reflectance.

In the inspection device in the related art as in PTL 1, a specific method of correcting an inter-beam phase difference other than those caused by defects due to the above causes (a) to (c) is not disclosed.

The invention has been made in view of the above problem, and an object of the invention is to provide a technique capable of reducing an influence of the inter-beam phase difference unrelated to the defect and accurately detecting even a defect having a low aspect ratio by a defect inspection device using differential interference contrast.

Solution to Problem

An example of the invention is a defect inspection device using differential interference contrast that inspects a specimen using light. The defect inspection device includes: a light source configured to emit a light beam; a polarized light separation element configured to split the light beam into a first beam and a second beam which are polarized and orthogonal to each other; a sensor configured to detect a signal from the first beam and the second beam reflected from the specimen; and a processing processor configured to process the signal detected by the sensor. The processing processor uses a signal string obtained based on information around a measured point to be measured on the specimen to correct a measured signal at the measured point.

Advantageous Effects of Invention

According to the invention, it is possible to reduce an influence of an inter-beam phase difference unrelated to a defect and to accurately detect even a defect having a low aspect ratio by the defect inspection device using differential interference contrast.

BRIEF DESCRIPTION OF DRAWINGS

FIG. 1 is a system configuration diagram showing a schematic configuration of a defect inspection device according to Embodiment 1.

FIG. 2 is a schematic configuration diagram of a DIC optical system of the defect inspection device according to Embodiment 1.

FIG. 3 is a diagram illustrating a problem of occurrence of a phase difference in a shear direction according to Embodiment 1.

FIG. 4 is a diagram illustrating a problem of occurrence of a phase difference in a shear vertical direction according to Embodiment 1.

FIG. 5 is a diagram illustrating a phase correction method according to Embodiment 1.

FIG. 6 is a diagram showing the other example of a specific correction phase calculation method according to Embodiment 1.

FIG. 7 is a processing flowchart of pre-correction using an NP shift according to Embodiment 1.

FIG. 8 is a diagram illustrating a problem of sensor detection sensitivity on a wafer as a premise according to Embodiment 1.

FIG. 9 is an explanatory diagram of overlap sub-pixel sampling according to Embodiment 1.

FIG. 10 is an explanatory diagram of a modification of the overlap sub-pixel sampling according to Embodiment 1.

FIG. 11 is an explanatory diagram of the other modification of the overlap sub-pixel sampling according to Embodiment 1.

FIG. 12 is a diagram illustrating a phase correction method in the overlap sub-pixel sampling according to Embodiment 1.

FIG. 13 is a processing flowchart of phase correction according to Embodiment 1.

FIG. 14 is a schematic configuration diagram of a DIC and vertical illumination optical system according to Embodiment 2.

FIG. 15 is an explanatory diagram of overlap sub-pixel sampling according to Embodiment 2.

FIG. 16 is a schematic configuration diagram of a DIC and vertical illumination optical system according to Embodiment 5.

DESCRIPTION OF EMBODIMENTS

Hereinafter, embodiments of the invention will be described with reference to the drawings.

Embodiment 1

FIG. 1 is a system configuration diagram showing a schematic configuration of a defect inspection device according to the present embodiment. In FIG. 1, the defect inspection device is a semiconductor inspection device, and includes an oblique illumination optical system 1000, a DIC and vertical illumination optical system 1100, oblique detection optical systems 1200-1 and 1200-2, a signal processing unit 1300, a stage unit 1400, and a control unit 1500.

The first oblique detection optical system 1200-1 and the second oblique detection optical system 1200-2 are arranged to be approximately symmetrical with respect to the DIC and vertical illumination optical system 1100. The oblique detection optical systems 1200-1 and 1200-2 basically have the same configuration. A configuration of a DIC optical system in the DIC and vertical illumination optical system 1100 will be described in detail below. The signal processing unit 1300 integrates and processes an obtained detection signal and outputs desired defect information. The stage unit 1400 and the control unit 1500 control an operation of a specimen stage in the stage unit 1400, and perform inspection of a defect at high speed by rotating or scanning, for example, a wafer 10 to be inspected placed on the specimen stage. In the specimen stage, a surface on which the wafer 10 to be inspected is placed is referred to as a wafer surface.

FIG. 2 is a schematic configuration diagram of the DIC optical system of the defect inspection device according to the present embodiment. In FIG. 2, a coherent light beam having an approximately circular cylindrical-shaped two-dimensional Gaussian intensity distribution emitted from a laser 101 which is a light source changes its path by a mirror 102, is shaped by a thin line illumination generation unit 103, is converted into an elliptical-shaped two-dimensional Gaussian intensity distribution, passes through a lens 104, is reflected by a half beam splitter (HBS) 105, passes through a ¼ wavelength plate (QWP) 106, a Nomarski prism (NP) 107, and an objective lens unit 108, and illuminates the wafer 10. The wafer surface is split into two beams which are polarized and orthogonal to each other by the NP 107 which is a polarized light separation element, and is illuminated with illumination light separated by a predetermined distance (shear amount, δ) by the two split beams. Reflected light from the wafer 10 sequentially passes through the objective lens unit 108, the NP 107, the QWP 106, and the HBS 105, is split into two beams by a polarized beam splitter (PBS) 109, and enters sensors 111 and 112. In the present embodiment, each of the sensors 111 and 112 is a line sensor (also referred to as an array sensor) in which light receiving elements are one-dimensionally arranged. This method of detecting interference signals having different polarization using the two sensors and obtaining shape information on the wafer surface by signal processing is referred to as polarization separation detection.

The stage unit 1400 includes a rotation stage 141 which is a first specimen stage and a translation stage 142 which is a second specimen stage. When DIC inspection is performed, a wafer is scanned in an R direction (radial direction of the wafer) by the translation stage 142 while being scanned in a 0 direction (circumferential direction of the wafer) by the rotation stage 141, whereby an entire surface of the wafer is spirally scanned to detect a defect on the entire surface of the wafer. Here, an arrangement direction of the light receiving elements of the sensor is set to have an optical relation to coincide with the R direction of the wafer, and a signal of a plurality of pixels can be detected in the R direction by detection of one shot (instant).

Signals detected by the sensors 111 and 112 are stored in a sensor signal buffer 131, which is a processing configuration in the signal processing unit 1300, and are sent to a signal integration processing unit 132 that integrates the signals. Thereafter, a phase correction processing unit 133 performs phase correction processing. Then, height restoration processing of a defect is performed by a height restoration and scattered light inspection signal integration unit 134 to obtain a result of the DIC inspection, the result is integrated with a result of scattered light inspection from a scattered light inspection optical system 110, and the integrated result is sent to an inspection result display unit 135 that displays an inspection result by threshold processing or the like to display the result. A hardware image of the signal processing unit 1300 is configured with a processing processor such as a general central processing unit (CPU) and a storage device, and the processing processor reads a program or information implementing each function from the storage device and executes a function of each processing unit by performing software processing of predetermined processing.

By the above processing, the DIC inspection and the scattered light inspection are performed on the entire surface of the wafer. Hereinafter, details and effects of the present embodiment in the DIC inspection will be described.

FIG. 3 is a diagram illustrating a problem of occurrence of a phase difference in a shear direction according to the present embodiment. (a) of FIG. 3 shows a schematic diagram of defect detection by DIC on a flat specimen. As shown in (a) of FIG. 3, two beams scan a specimen (wafer) surface 114. When the beams irradiate a flat portion of a specimen surface, a phase difference between the beams is constant, and no phase shift or beam intensity variation occurs. On the other hand, when there is a defect on the specimen surface 114 and an optical path length of one beam is longer (or shorter) than that of the other beam, the phase difference occurs between the beams, and a detection value of the beam intensity varies accordingly. Based on this variation, presence of a defect on the specimen surface 114 can be detected. A defect height can be estimated as follows.

As shown in FIG. 2, by using the PBS 109, the reflected light from the wafer 10 is split by an orthogonal polarized light component, and the interference signals are detected by two sensors. Here, detection signals of the sensors can be expressed by the following Formula (1).

[Formula 1]

$$I_i \propto I_P + I_S + 2\sqrt{I_P I_S}\cos\left(\frac{4\pi}{\lambda}\Delta h + \phi_{NP} + \phi_{dtc} + \phi_{dst}\right) \quad (1)$$

where, $I_i$ is a detection intensity of the ith sensor, $I_P$ and $I_S$ are intensities of respective reflected light of two beams split on the wafer surface, λ is a wavelength of the light source, Δh is a differential height of an inspection object, $\varphi_{NP}$ is a phase difference of reciprocation given by the NP 107, $\varphi_{dtc}$ is a phase (detector) determined by a configuration of a detection optical system, and $\varphi_{dst}$ is phase distribution (disturbance) such as wafer inclination or optical system dependent aberration.

In the optical system shown in FIG. 2, an optical configuration including the NP 107 is adjusted so that $\varphi_{NP}=\pi/2$ and $\varphi_{dst}=0$ in both the sensors 111 and 112, and since the beams are split using the PBS 109, when $\varphi_{dtc}=\pi$ in the sensor 111, $\varphi_{dtc}=0$ in the sensor 112. Thus, detection intensities $I_1$ and $I_2$ by the sensors 111 and 112 are respectively expressed by the following Formula (2).

[Formula 2]

$$I_1 \propto I_P + I_S + 2\sqrt{I_P I_S}\sin\left(\frac{4\pi}{\lambda}\Delta h\right) \quad (2)$$

$$I_2 \propto I_P + I_S - 2\sqrt{I_P I_S}\sin\left(\frac{4\pi}{\lambda}\Delta h\right)$$

Thus, differential height information Δh can be calculated from the two detection signals by the following Formula (3).

[Formula 3]

$$\Delta h = \frac{\lambda}{4\pi}\arcsin\left(\frac{I_1 - I_2}{I_1 + I_2}\right) \quad (3)$$

From a sign of Δh, it can also be determined whether a defect is a convex defect or a concave defect. Here, by adjustment of the optical system and processing (gain and offset processing) of a sensor signal, adjustment is made in advance such that $I_P=I_S$, that is, $I_P+I_S=2\sqrt{I_P I_S}$. Accordingly, a differential height can be measured robustly with respect to illumination intensity distribution, variation of a laser light intensity, and variation of reflectance of the wafer surface, and a defect shape can be restored using the differential height information. In the present embodiment, in $I_1$ and $I_2$, there are signals corresponding to the light receiving elements (pixels) of the array sensors 111 and 112. Therefore, $I_1$ and $I_2$ in this calculation processing are calculated for each pixel of the corresponding array sensor or for each grouped pixel. Therefore, positions and angles of the array sensors 111 and 112 need to be adjusted so that reflected light signals at the same position on the wafer can be detected by the corresponding pixels. Here, an arcsin function may be calculated by approximation to a polynomial expression or the like using Taylor expansion or the like in order to reduce a calculation load and improve a calculation speed.

A contrast between the detection signals obtained at a certain shear amount δ (the difference (Δh) between defect heights irradiated with the respective beams) greatly varies depending on an aspect ratio (a gradient in a height direction) of the defects. For a defect having a low aspect ratio, higher accuracy is required because the contrast between the detection signals is small. If the phase difference occurs due to a cause other than the defect heights, detection accuracy is greatly affected, and therefore it is difficult to perform accurate height detection. Therefore, in the present embodiment, an influence of an inter-beam phase difference caused by the cause other than the defect heights is reduced.

(b) of FIG. 3 is a schematic diagram in a case where the specimen surface 114 is relatively inclined with respect to an incident beam. Such a state occurs due to, for example, strain of a wafer or inclination of a stage. In this case, even in a flat portion having no defect, a height of Δhf is unintentionally detected. Further, in a portion where there is a defect, a defect height obtained by adding Δhf to the defect height Δht which is originally desired to be detected is detected, and it is not possible to measure a correct height. Furthermore, the Δhf is not always constant at any time, and may vary in a scanning direction as shown in the figure. This influence becomes more remarkable as the shear amount δ increases. On the other hand, in order to detect the defect having a low aspect ratio with high contrast, the shear amount δ is preferably large. Therefore, this problem is an essential problem in detecting the defect having a low aspect ratio. Occurrence of such an unintended phase difference is expressed as $\varphi_{dst}$ in Formula (1). The differential height can be expressed as $\Delta hf=\lambda_{\varphi dst}/(4\pi)$. $\varphi_{dst}$ occurs not only due to the wafer inclination but also due to positional deviation of the NP 107 and the optical configuration.

FIG. 4 is a diagram illustrating a problem of occurrence of a phase difference in a shear vertical direction according to the present embodiment. FIG. 4 is a schematic diagram in a case where $\varphi_{dst}$ changes within a visual field of an inspection device (a region in which inspection can be performed instantaneously). This appears due to a deviation between the detection signals of the sensor 111 and the sensor 112 on a flat surface. The sensor 111 and the sensor 112 are each configured with an array sensor in which detection elements are arranged in an array (one-dimensional sensor in which sensors are arranged in an R direction (visual field direction)).

When the flat portion is scanned, it is desirable that detection values of the respective detection elements (pixels) of the sensor 111 and the sensor 112 are all the same. However, for example, when aberration occurs due to an unintended inclination of the NP 107 or positional deviation of an optical element, the detection values of the respective detection elements are not uniform, and the detection values are different as shown in FIG. 4. This corresponds to a change in $\varphi_{dst}$ in the visual field. As described above, the unintended phase difference $\varphi_{dst}$ may cause variation in the scanning direction, spatial variation (in the visual field), and temporal variation, and causes a problem of a serious measurement error in the DIC inspection.

FIG. 5 is a diagram illustrating a phase correction method for correcting the above influence of $\varphi_{dst}$ in the present embodiment. In FIG. 5, detection signals from the sensor 111 and the sensor 112 are first stored in a memory 1 (1311) and a memory 2 (1312) in the sensor signal buffer 131 which is the processing configuration in the signal processing unit 1300. These signals are input as time-series signals by scanning. Since the sensor 111 and the sensor 112 are array sensors, signals from a plurality of pixels are simultaneously input. The time-series sensor signals are divided into desired processing units and sent to the signal integration processing unit 132.

The signal integration processing unit 132 integrates the sensor signals and stage signals obtained from the stage unit 1400 and the control unit 1500 (FIG. 1), calculates a position correspondence on the specimen, and performs preprocessing such as removal of unnecessary data and resampling. Thereafter, the preprocessed data is sent to the phase correction processing unit 133 to perform correction phase calculation processing 1331. The correction phase calculation processing 1331 is performed for each pixel corresponding to the sensor 111 and the sensor 112 or for each grouped pixel. A method of calculating a correction phase will be described later. Using the correction phase, phase correction processing is performed in 1332 to calculate a differential height.

It is expected that the obtained differential height corresponds to height information on a desired defect from which the above influence of $\varphi_{dst}$ is removed or reduced. The height restoration and scattered light inspection signal integration unit 134 integrates and processes the differential height information, restoration height information calculated by height restoration processing 1341 according to processing such as integration calculation using the differential height information, information on the other defects, and scattered light inspection information in scattered light inspection signal integration processing 1342, and outputs a final defect inspection result to the inspection result display unit 135.

The inspection result display unit 135 determines a defect inspection result by threshold processing 1351, and displays the defect inspection result as an inspection result to the user in inspection result display processing 1352.

The restoration height information can be calculated by, for example, integrating Δh in the scanning direction (shear direction) in consideration of the shear amount γ. Alternatively, by performing filtering processing, convolution processing, processing in a frequency space, and the like corresponding to the calculation, it is possible to restore a desired detected defect shape while reducing an influence of noise.

By integrating and processing information of the DIC inspection and information of the scattered light inspection, for example, defect classification can be performed with high accuracy and used for analysis of a defect occurrence process. In addition, since entire surface inspection of the wafer surface can be performed at high speed by simultaneously performing the DIC inspection and the scattered light inspection, throughput of shipping inspection and acceptance inspection can be increased, and efficiency of the process can be implemented.

Next, an example of a specific correction phase calculation method will be described. For example, respective time averages of the signals of the sensor 111 and the sensor 112 are calculated. A time length for calculating the time average can be specified by a user, for example. For example, when the specimen is inclined and the phase difference between the beams is deviated due to the inclination, the deviation thereof can be equalized by obtaining a time average of each beam component. In other words, the time average of each beam component can be converted into a value corresponding to the inter-beam phase difference caused by the inclination of the specimen, and can be used as the correction phase. When the correction phase is set to $\overline{\varphi_{dst}}$, the differential height Δh of a defect to be obtained can be obtained by the following Formula (4).

[Formula 4]

$$\overline{\phi_{dst}} = \arcsin\left(\frac{\overline{I_1} - \overline{I_2}}{\overline{I_1} + \overline{I_2}}\right) \tag{4}$$

$$\Delta h \approx \frac{\lambda}{4\pi}\left(\arcsin\left(\frac{I_1 - I_2}{I_1 + I_2}\right) - \overline{\phi_{dst}}\right)$$

where, $\overline{I_1}$ and $\overline{I_2}$ represent time average values. $I_1$ and $I_2$ represent instantaneous values. Accordingly, phase correction can be performed. The formula is merely an example of the calculation method, and an appropriate calculation method can be selected in view of calculation accuracy, a speed, and a load.

FIG. 6 is a diagram showing the other example of a specific correction phase calculation method according to the present embodiment. The correction phase can be basically calculated using information around a point to be measured, and a plurality of variations other than the above average value calculation may be considered, and an optimum method may be selected from a viewpoint of correction accuracy, a calculation speed, or the like.

In order to calculate a differential height of the detection element (pixel) position shown in FIG. 6, sensor detection information in a region S used for correction or differential height information obtained from the information is used. A size of the region S can be set to any range, and is preferably sufficiently larger than a typical defect size of a measurement object. The region S may extend only in the θ direction or only in the R direction. An influence of $\varphi_{dst}$ variation in the θ direction and the R direction can be reduced. It may straddle a circuit in the R direction. The correction phase is calculated from the entire region S or a part of the information. When a function for calculating the correction phase $\hat{\varphi}_{dst}$ from the information of the region S is f(S), the differential height Δh of the pixel is expressed by the following Formula (5).

[Formula 5]

$$\hat{\phi}_{dst} = f(S) \tag{5}$$

$$\Delta h \approx \frac{\lambda}{4\pi}\left(\arcsin\left(\frac{I_1 - I_2}{I_1 + I_2}\right) - \hat{\phi}_{dst}\right)$$

For example, f(S) may be a function for calculating a low-frequency component in the S region for the detection signals from the sensor 111 and the sensor 112. Here, with respect to the low-frequency component, other feature calculation methods such as a band limiting filter (low pass filter), an average value or a median value calculation, and polynomial approximation can be used. In particular, as the polynomial approximation, linear line approximation and a method of extending the linear line to a higher-order curve can be considered. Since S may extend two-dimensionally in the R direction and the θ direction, S may be expanded to a two-dimensional plane approximation, a high-order curved surface, or the like. In addition, for example, a differential height signal (or a phase difference signal) calculated using the detection signals of the sensor 111 and the sensor 112 may be calculated as f(S) in the S region, and a low-frequency component of the signal may be obtained by the above method or the like.

Further, correction processing may be performed by calculating the restoration height information from the differential height signal of the S region and obtaining a low-frequency component of the restoration height information by the above method or the like. In this case, height correction using correction height distribution is performed instead of the correction phase.

Although the method of performing the phase correction substantially in real time using a measurement result has been described above, it is also effective to measure an initial state of information corresponding to the correction phase in advance and use correction using the initial state in combination (the correction is referred to as pre-correction). For example, as shown in FIG. 4, before wafer inspection, the phase distribution $\hat{\varphi}_{dst}$ in the visual field can be obtained from the information of the sensor 111 and the sensor 112 by the following Formula (6).

[Formula 6]

$$\hat{\phi}_{dst} = \arcsin\left(\frac{I_1 - I_2}{I_1 + I_2}\right) \tag{6}$$

At this time, for example, a flat wafer (reference specimen surface) having no reference defect is used as the wafer. Accordingly, $\varphi_{dst}$ caused by the optical system can be measured in advance. This measurement is also calculated for each corresponding pixel of the array sensor or for each grouped pixel.

Further, since $\varphi_{NP}$ can be shifted by displacing the NP 107 shown in FIG. 2, it is possible to perform more accurate pre-correction using the shifted $\varphi_{NP}$. FIG. 7 is a flowchart of pre-correction processing using an NP shift according to the present embodiment. In FIG. 7, first, a typical measurement specimen (wafer) is prepared and adjusted to a certain position (specimen position adjustment) in step S101. Subsequently, in step S102, the NP 107 is shifted in a direction (shear direction) in which a beam perpendicular to an optical axis is split by about several μm, thereby changing a phase difference between two beams on the wafer (NP shift). In this state, in step S103, a detection signal of a sensor is obtained (sensor signal detection). By repeating this operation until the measurement is completed in step S104, correction phase distribution can be measured in advance by a method such as fringe scan. For example, when the fringe scan of four-phase detection is performed, the NP shift is performed so as to change the phase difference by π/2, and the measurement is performed four times. In step S105, $\varphi_{dst}$ distribution in the visual field can be measured with high accuracy from the obtained detection signal with four-phase differences. That is, information around a measured point to be measured on the specimen is prior information obtained before the measurement. This operation is repeated until the measured point ends in step S106, and a pre-correction phase is calculated in step S107.

By increasing the number of times of measurement or combining polarization separation detection by two sensors, the pre-correction with high SN can be performed. Furthermore, by obtaining $\varphi_{dst}$ information at a plurality of positions of the typical measurement specimen, $\varphi_{dst}$ information on the entire surface of the wafer can also be obtained. For example, a measurement result can be corrected by measuring tendency of wafer strain (height variation) due to an influence of a wafer chucking structure in advance.

According to the above method, highly accurate height measurement of the specimen can be implemented by performing the phase correction. However, only with this method, a problem that sensitivity non-uniformity occurs due to an influence between pixels (boundaries between adjacent pixels) of the array sensors remains, and it is not possible to implement a high-sensitivity inspection over the entire surface of the wafer.

FIG. 8 is a diagram illustrating a problem of sensor detection sensitivity on the wafer as a premise according to the present embodiment. (a) is a diagram schematically showing a sensor image projected on the wafer surface. (b) is a diagram showing a relation between a defect position and a detection signal. As shown in (b), the sensitivity is high when the defect position is at the center of each sensor pixel, and the sensitivity is low when the defect position is at a boundary portion between pixels (between pixels). A cause for this is that in a case of detecting a fine defect signal equal to or less than a size of the pixel, when the defect position is at the center of the pixel, a signal level of one pixel is high, but when the defect position is between the pixels, the signal is divided into two pixels across the pixels, and thus a detection signal level is low. A defect detection threshold is set by setting a defect determination threshold for a defect measurement height restored from the main signal, for example. At this time, even if the defect has the same height, depending on whether the defect position is at the center of the pixel or between the pixels, a case where the defect detection threshold is larger than the defect determination threshold or a case where the defect detection threshold is smaller than the defect determination threshold may occur, and the defect may be overlooked. Such variation in a defect measurement height depending on a position on the wafer (an image position on the sensor) is referred to as sensitivity non-uniformity in the present embodiment.

As a countermeasure, for example, a method of making the sensitivity more uniform by making resolution of the optical system sufficiently rougher than a pixel pitch of the array sensors, that is, (1) reducing the resolution of the optical system to an extent that the influence between pixels can be ignored, or (2) making the pixel pitch finer, is considered. However, in (1), there is a problem that a small defect is overlooked due to a decrease in detection resolution. In addition, in (2), when an inspection range (visual field) in one scan is reduced and throughput is reduced, or when the inspection range is maintained, the number of pixels is increased and a data capacity of input and output signals is increased, so that a system is expected to increase in scale and cost. Therefore, it is actually difficult to make the resolution of the optical system sufficiently rougher than the pixel pitch of the array sensors.

The sensitivity non-uniformity becomes more remarkable when light receiving units of a sensor are spatially separated. For example, when inspection is performed using a high-sensitivity sensor array, there is a case where several tens of MHz that greatly exceeds a line rate of a normal line sensor is required, and in this case, a multi-anode photo multiplier tube (PMT), an avalanche photo diode (APD) array, a photo diode (PD) array, or the like is applied. In such a case, unlike a typical line sensor, there is a limit to bring the pixels close to each other so as not to cause discharge by applying a high voltage to APD or PMT association. That is, it is difficult to reduce a pixel size of the sensor, and a non-negligible insensitive region is generated between the pixels. In such a case, the sensitivity non-uniformity becomes more remarkable.

In the present embodiment, the influence between pixels (sensitivity reduction region and insensitive region) as described above is solved by overlap sub-pixel sampling to be described below.

FIG. 9 is an explanatory diagram of the overlap sub-pixel sampling according to the present embodiment. In FIG. 9, when the DIC inspection is performed by the above DIC optical system, scanning is performed such that a feed pitch of an R-direction translation stage (a shift amount of a sensor projection image on the wafer at the same 0 position) is set to a non-integer multiple of the pixel pitch (for example, 2.5 in the drawing) and overlaps. Accordingly, in the Nth round and (N+1)th round, since the projection image on the wafer surface of the array sensor is shifted by a half pixel, and a sampling point is shifted by a half pixel, a position corresponding to a pixel boundary in the Nth round is the center of the pixel in the (N+1)th round. Thus, by integrating information in the Nth round and information in the (N+1)th round, it is possible to reduce the sensitivity of non-uniformity due to the influence between the pixels, and to implement sensitivity uniformity. In addition, by preparing the R-direction feed pitch of a plurality of modes, it is possible to adjust a tread-off relation between throughput and sensitivity of the inspection. That is, when the R-direction feed pitch is small, an overlap region becomes large, so that the sensitivity of the inspection is improved, but a time required for entire surface inspection is delayed, the throughput is reduced, and when the R-direction feed pitch is large, reverse is made. When a plurality of R-direction feed pitches are R1, R2, R3, . . . , and a pixel pitch of an array sensor is p, it is desirable that all of R1/p, R2/p, R3/p, . . . are non-integers. When the number of array sensor pixels is an integer K, 0<R1/p, R2/p, R3/p, . . . <K are satisfied. Accordingly, an effect of the overlap sub-pixel sampling can be obtained at any R-direction feed pitch, and an influence of the sensitivity non-uniformity due to pixels can be reduced to make the sensitivity on the wafer surface uniform.

FIG. 10 is an explanatory diagram of a modification of the overlap sub-pixel sampling according to the present embodiment. In FIG. 10, (a) is a diagram schematically showing a sensor image projected on a wafer surface. (b) is a diagram in which a movable mask or a pinhole array is placed in front of the sensor shown in (a) so that a size of a pixel in a line direction can be limited. For example, the movable mask shown in (b) can be taken in and out, and a pixel size can be adjusted in multiple stages by a drive mechanism or the like. The pixel size is switched by a change in the R-direction feed pitch (a size of the overlap region). Accordingly, for example, when the R-direction feed pitch is decreased (the size of the overlap region is increased) and the sampling is densely performed, a spatial resolution can be improved by decreasing the pixel size with the movable mask. Meanwhile, when the R-direction feed pitch is increased (the size of the overlap region is decreased) and the sampling is sparsely performed, light use efficiency can be improved and the insensitive region can be eliminated by increasing the pixel size without the movable mask. The same effect can be achieved by using not only the mask on the sensor side but also the illumination intensity distribution.

FIG. 11 is an explanatory diagram of the other modification of the overlap sub-pixel sampling according to the present embodiment. As shown in FIG. 11, by changing a shape of illumination light from, for example, (a) to (b) depending on an overlap size (R-direction feed pitch modes R1, R2, R3, . . . ), it is possible to achieve a high resolution. That is, as shown in (b), since an effective pixel size is limited by structural illumination in which the illumination light is formed in a stripe shape, it is possible to reduce an influence of blur due to the sensor and achieve the high resolution.

The above phase correction that corrects the influence of $\varphi_{dst}$ is also applicable to the overlap sub-pixel sampling. When the above overlap sub-pixel sampling is performed, the same $\varphi_{dst}$ may not be obtained in the Nth round and the (N+1)th round. Thus, for example, a restoration height calculated by Formula (3) becomes non-naturally discontinuous at each sampling point in the Nth round and the (N+1)th round, or a streaky artifact in the θ direction occurs in a restoration height map. Therefore, an accurate differential height can be measured by correcting initial phase shift and dynamic phase shift that occur when $\varphi_{dst}$ #0.

FIG. 12 is a diagram illustrating a phase correction method in the overlap sub-pixel sampling according to the present embodiment. As shown in FIG. 12, a case will be considered in which a differential height of a certain point (the pixel) on the wafer is calculated in the overlap region in the Nth round and the (N+1)th round. At this time, a region S used for correction is set as a region S extending over sampling points of scanning regions in front of and behind the pixel in the θ direction and sampling points in the R direction in the Nth round and the (N+1)th round. Then, the correction phase $\hat{\varphi}_{dst}$ of Formula (5) is calculated using a detection signal in the region S. $\hat{\varphi}_{dst}$ is a dynamic correction parameter that changes depending on the region S, and any one of the above calculation methods of $\hat{\varphi}_{dst}$ or a combination thereof can be used.

FIG. 13 is a processing flowchart of phase correction according to the present embodiment. In FIG. 13, first, in step S201, detection sensor signals in the Nth round, the (N+1)th round, and the like are input, and in step S202, information of the detection sensor signals for a plurality of rounds is stored in a sensor signal buffer. Then, in step S203, the signal integration processing unit 132 integrates the information for several rounds, and in step S204, the phase correction processing unit 133 calculates the correction phase $\overline{\varphi}_{dst}$ Then, in step S205, a differential height after the phase correction is calculated. Then, in step S206, the height restoration and scattered light inspection signal integration unit 134 performs height restoration processing and scattered light inspection signal integration processing, and in step S207, the inspection result display unit 135 displays an inspection result.

By performing the phase in accordance with a processing flow shown in FIG. 13, the influence of $\varphi_{dst}$ is corrected, and it is possible to solve the above problem that a calculated value of the differential height becomes discontinuous on the wafer surface, and it is possible to perform the defect inspection with high sensitivity over the entire surface of the wafer.

As described above, according to the present embodiment, the influence of the inter-beam phase difference unrelated to the defect can be reduced and even the defect having a low aspect ratio can be accurately detected by a defect inspection device using the DIC inspection.

Embodiment 2

In the present embodiment, a modification of the DIC optical system will be described. FIG. 14 is a schematic configuration diagram of a DIC and vertical illumination optical system according to the present embodiment. In FIG. 14, the same components as those in FIG. 2 are denoted by the same reference numerals, and description thereof is omitted. FIG. 14 is different from FIG. 2 in that an R-direction beam scanning optical system 120 is provided instead of the thin line illumination generation unit 103, and the array sensors 111 and 112 are single pixel sensors (point sensors) 121 and 122.

In FIG. 14, a DIC and vertical illumination optical system 1110 includes a spot scanning optical system, includes the R-direction beam scanning optical system 120 instead of the thin line illumination generation unit, and scans a light spot in the R-direction, thereby enabling detection by the point sensors 121 and 122 instead of the array sensor. Accordingly, the entire surface of the wafer can be inspected in the same manner as in Embodiment 1. That is, the phase correction and overlap sub-pixel shift sampling described in Embodiment 1 can also be performed by the spot scanning optical system in the present embodiment. In addition, since the present optical system does not use the array sensor, there is a possibility that a configuration of the sensor can be simplified, cost can be reduced, a speed can be increased, and a size can be reduced. Further, there is an advantage that intensity distribution in the R direction becomes constant. In addition, since it is also possible to use a light receiving element that is difficult to form the array sensor, for example, it is possible to implement high-sensitivity detection or the like using an element capable of detecting a single photon level.

FIG. 15 is an explanatory diagram of the overlap sub-pixel sampling in the present embodiment. As shown in FIG. 15, also in the spot scanning, since the sampling points are discrete, similarly to Embodiment 1, it is possible to reduce a decrease in sensitivity between the sampling points by shifting the sampling points by sub-pixels in the Nth round and the (N+1)th round.

Also in the optical system according to the present embodiment, the spatial resolution can be improved by the same effect as that described with reference to FIG. 11 by making an illumination spot size variable depending on the R-direction feed pitch. The spot size can be made variable by, for example, installing a pinhole or using a zoom lens mechanism.

As described above, according to the present embodiment, in addition to the effects of Embodiment 1, there is an advantage that the configuration of the sensor is simple, the cost can be reduced, the speed can be increased, and the size can be reduced, and the intensity distribution in the R direction becomes constant. It is also possible to use the light receiving element which is difficult to form the array sensor.

Embodiment 3

In the present embodiment, still another modification of the DIC optical system will be described. In Embodiments 1 and 2, a two-polarization-separation detection optical system using two sensors is adopted, but in the present embodiment, simplification and cost reduction of the optical system are implemented by using a single sensor.

The optical system in the present embodiment is the same as that in FIG. 2 in Embodiment 1, but the sensor 112 can be omitted. In the present embodiment, for example, the differential height is detected by performing phase correction based on time average as in Formula (7).

[Formula 7]

$$\overline{\phi_{dst}} = \arcsin\left(2\frac{\overline{I_1} - I_{min}}{I_{max} - I_{min}} - 1\right) \tag{7}$$

$$\Delta h \approx \frac{\lambda}{4\pi}\left(\arcsin\left(2\frac{I_1 - I_{min}}{I_{max} - I_{min}} - 1\right) - \overline{\phi_{dst}}\right)$$

where, $I_1$ and $\overline{I_1}$ represent an instantaneous value of a detection signal of a sensor and a time average value thereof, and $I_{min}$ and $I_{max}$ are the minimum value and the maximum value of $I_1$ when the phase $\varphi_{NP}$ is changed from 0 to $2\pi$ by a method such as shifting NP in the shear direction in advance. According to the present embodiment, the differential height can be measured by performing phase correction using the single sensor. When the sensor is an array sensor, for example, $I_{min}$ and $I_{max}$ have different values (within the visual field) depending on each pixel due to an influence of the illumination intensity distribution. Further, $\overline{\varphi_{dst}}$ also has different values (within the visual field) depending on each pixel.

Furthermore, as in Embodiment 1, phase correction using surrounding information is also possible. In this case, the differential height is detected by Formula (8).

[Formula 8]

$$\hat{\phi}_{dst} = f(S) \tag{8}$$

$$\Delta h \approx \frac{\lambda}{4\pi}\left(\arcsin\left(2\frac{I_1 - I_{min}}{I_{max} - I_{min}} - 1\right) - \hat{\phi}_{dst}\right)$$

where, f is a function for obtaining the same low-frequency component as described above.

Also in the present embodiment, the pre-correction is effective. In the present embodiment using the single sensor, it is not possible to distinguish the detected intensity change and height variation due to variation of reflectance of the specimen surface or the like. Therefore, it is expected that the correction phase caused by the optical system is acquired by the pre-correction, and the influence of the variation of reflectance or the like is corrected by real-time correction, thereby reducing a correction amount in real-time processing and improving measurement accuracy. The differential height can be measured by Formula (9).

[Formula 9]

$$\hat{\phi}^{pre}_{dst} = \arcsin\left(2\frac{I^{pre}_1 - I_{min}}{I_{max} - I_{min}} - 1\right), \hat{\phi}^{real}_{dst} = f\left(S, \hat{\phi}^{pre}_{dst}\right) \tag{9}$$

$$\Delta h \approx \frac{\lambda}{4\pi}\left(\arcsin\left(2\frac{I_1 - I_{min}}{I_{max} - I_{min}} - 1\right) - \hat{\phi}^{real}_{dst}\right)$$

where, an additional character pre means that measurement is performed in advance using the reference specimen surface or the like. Based on $$\hat{\varphi}^{pre}_{dst},$$

an intra-visual field phase difference caused by the optical system is corrected in advance, and based on $$\hat{\varphi}^{real}_{dst},$$

a phase difference caused by an influence of wafer strain or the like in real time is corrected.

$$\hat{\varphi}^{real}_{dst}$$

is calculated from $$\hat{\varphi}_{dst}^{pre}$$

measured in advance and information of the surrounding region S. The calculation method is the same as the above low-frequency component calculation method. As described above, the DIC inspection can be performed by a simple optical system of the single sensor while reducing the influence of the height variation. The method in the present embodiment can be applied to both the line sensor in Embodiment 1 and the point sensor in Embodiment 2.

Embodiment 4

In the present embodiment, the other modification of the DIC optical system will be described. In Embodiments 1 to 3, the sensor is a one-dimensional array sensor or a point sensor, but in the present embodiment, a two-dimensional sensor having a two-dimensional pixel structure is used.

Examples of the two-dimensional sensor include a CCD sensor and a CMOS sensor. Accordingly, there is an advantage that it is not necessary to mechanically adjust a position of the sensor with high accuracy, that is, it is possible to correct the position of the sensor by software. In this case, the shear direction may be the R direction instead of the θ direction. Since spatial resolution to be detected is different between the shear direction and a direction orthogonal thereto, inspection accuracy is affected. In particular, when the strain of the wafer is smaller in the R-direction than in the θ-direction, the influence of the strain of the wafer can be reduced by setting the shear direction to the R-direction, and the height can be measured with high accuracy.

Embodiment 5

In the present embodiment, the other modification of the DIC optical system will be described. FIG. 16 is a schematic configuration diagram of a DIC and vertical illumination optical system according to the present embodiment. In FIG. 16, the same components as those in FIG. 2 are denoted by the same reference numerals, and description thereof is omitted. FIG. 16 differs from FIG. 2 in that the HBS 105 is used instead of the PBS 109. In addition, in front of the sensors 111 and 112, polarizers 124 and 125 such as a wire grid and the PBS are inserted.

In the embodiments described above, the differential height is calculated from two sensor signals in which $\varphi_{dtc}$ in Formula (1) becomes π and 0 by using the PBS in front of the sensor. In contrast, in the present embodiment, as shown in FIG. 16, $\varphi_{dtc}$ can be set to a desired value by adjusting angles of the polarizers 124 and 125 in front of the sensors 111 and 112. For example, when $\varphi_{dtc}=(0, \pi/2)$ and $\varphi_{NP}=-\pi/2$, the detection intensities $I_1$ and $I_2$ of the sensors 111 and 112 are respectively expressed by the following Formula (10),

[Formula 10]

$$I_1 \propto I_P + I_S + 2\sqrt{I_P I_S}\sin\left(\frac{4\pi}{\lambda}\Delta h + \phi_{dst}\right) \tag{10}$$

$$I_2 \propto I_P + I_S + 2\sqrt{I_P I_S}\cos\left(\frac{4\pi}{\lambda}\Delta h + \phi_{dst}\right)$$

Thus, the differential height information Δh is obtained by the following Formula (11), for example, and the phase can be detected.

[Formula 11]

$$g_1 = \frac{I_{1max} + I_{1min}}{2},\ g_2 = \frac{I_{2max} + I_{2min}}{2}, \tag{11}$$

$$\hat{\phi}_{dst} = \text{arctan2}\left(\overline{I_1} - g_1, \overline{I_2} - g_2\right)$$

$$\Delta h = \frac{\lambda}{4\pi}\left(\text{arctan2}(I_1 - g_1, I_2 - g_2) - \hat{\phi}_{dst}\right)$$

where, $I_{1max}$, $I_{1min}$, $I_{2max}$, and $I_{2min}$ respectively represent the maximum value and the minimum value of the sensor 111 and the maximum value and the minimum value of the sensor 112 obtained by the above NP shift in advance.

According to calculation using an arctan 2 function, since the phase is obtained in a range of 2π from −π to +n, phase detection (differential height detection) can be performed in a dynamic range twice as large as a range of n from −π/2 to +π/2 in the case of Embodiment 1 using arcsin.

In addition, robustness is improved with respect to a decrease in visibility in a case ($I_P \neq I_S$) where intensities of two beams on the specimen surface do not coincide with each other by differential interference measurement.

The above discussion can be extended to a general case other than a combination in which $\varphi_{dtc}$ is (0, π). In this case, Δh can be obtained using the following Formula (12)

[Formula 12]

$$\overline{\phi_{dst}} = -\text{arctan2}\left(\frac{(\overline{I_1} - g_1) - (\overline{I_2} - g_2)}{\tan\left(\frac{\phi_{dtc1} - \phi_{dtc2}}{2}\right)}, (\overline{I_1} - g_1) + (\overline{I_2} - g_2)\right) - \phi_{NP} - \frac{\phi_{dtc1} + \phi_{dtc2}}{2} \tag{12}$$

$$\Delta h \approx \frac{\lambda}{4\pi}\left(-\text{arctan2}\left(\frac{(I_1 - g_1) - (I_2 - g_2)}{\tan\left(\frac{\phi_{dtc1} - \phi_{dtc2}}{2}\right)}, (I_1 - g_1) + (I_2 - g_2)\right) - \phi_{NP} - \frac{\phi_{dtc1} + \phi_{dtc2}}{2} - \overline{\phi_{dst}}\right)$$

In the present embodiment, the phase correction based on the time average has been described as an example, but the phase correction using the low-frequency component of the surrounding region S may be applied as in Embodiment 1.

By the above method, the DIC inspection can be implemented by setting the $\varphi_{dtc}$ to any value. By adjusting the $\varphi_{dtc}$, the DIC inspection suitable for a measurement purpose and a noise characteristic can be implemented.

In the above embodiment, the correction based on the phase has been described. However, since the phase has a relation with the differential height by a relation of $\Delta h=\lambda\varphi/(4\pi)$, the same correction can be performed by the differential height Δh. That is, the above $\varphi_{dst}$ can be converted into $\Delta h_{dst}=\lambda\varphi_{dst}/(4\pi)$ and implemented.

When the scattered light inspection and the DIC inspection are performed simultaneously, since configurations of an illumination system and a detection system can be independently set, it is not necessary to match a visual field position, a visual field size, a pixel pitch and a pixel size of a sensor, and the like. However, the R-direction feed pitch is consistent because it depends on the translation stage. Therefore, in the scattered light inspection and the DIC inspection, according to the configurations of the illumination system and the detection system, both a scattered light inspection pixel pitch $P_{SCT}$ and a pixel pitch $P_{DIC}$ of the DIC inspection are set to non-integer multiples of the R-direction feed pitch, that is, "R1/$P_{DIC}$, R2/$P_{DIC}$, R3/$P_{DIC}$, . . . ", and "R1/$P_{SCT}$, R2/$P_{SCT}$, R3/$P_{SCT}$, . . . " are all set to non-integers, so that the overlap sub-pixel sampling can be performed in both inspection, and the sensitivity uniformity can be implemented simultaneously in both inspection.

Although the embodiments have been described above, the above embodiments have been described in detail to facilitate understanding of the invention, and the invention is not necessarily limited to those including all the configurations described above. A part of a configuration according to one embodiment can be replaced with a configuration according to another embodiment, and a configuration according to one embodiment can also be added to a configuration according to another embodiment. A part of a configuration according to each embodiment may be added, deleted, or replaced with another configuration.

REFERENCE SIGNS LIST

10: wafer
101: laser
102: mirror
103: thin line illumination generation unit
104: lens
105: half beam splitter (HBS)
106: ¼ wavelength plate (QWP)
107: Nomarski prism (NP)
108: objective lens unit
109: polarized beam splitter (PBS)
110: scattered light inspection optical system
111, 112: sensor (line sensor, array sensor)
114: specimen surface
120: R-direction beam scanning optical system
121, 122: single pixel sensor (point sensor)
124, 125: polarizer
131: sensor signal buffer
132: signal integration processing unit
133: phase correction processing unit
134: height restoration and scattered light inspection signal integration unit
135: inspection result display unit
141: rotation stage
142: translation stage
1000: oblique illumination optical system
1100, 1110, 1120: DIC and vertical illumination optical system
1200-1, 1200-2: oblique detection optical system
1300: signal processing unit
1400: stage unit
1500: control unit

The invention claimed is:

1. A defect inspection device using differential interference contrast that inspects a specimen using light, the defect inspection device comprising:

a light source configured to emit a light beam;

a polarizing beam splitter configured to split the light beam into a first beam and a second beam which are polarized and orthogonal to each other;

a sensor configured to detect a signal from the first beam and the second beam reflected from the specimen; and a processing processor configured to:

receive a signal string obtained based on information in at least one dimension around a measured point to be measured on the specimen;

filter the information from the signal string to extract a low-frequency component;

determine a phase correction for the sensor based on the low-frequency component, wherein the phase correction corrects a phase difference between the first beam and the second beam, and interference signals having different polarization are detected using the sensor;

generate corrected interference signals based on the phase correction; and generate shape information on a specimen surface of the specimen by signal processing the corrected interference signals using the low-frequency component.

2. The defect inspection device according to claim 1, further comprising:

a specimen stage on which the specimen is placed, wherein the specimen stage is driven in a circumferential direction and a radial direction of the specimen, one point on the specimen surface is overlapped and scanned at least twice in the circumferential direction, and a scanning pitch in the radial direction is a non-integer multiple of a pixel pitch of the sensor.

3. The defect inspection device according to claim 1, further comprising:

a beam scanning optical system configured to scan the light beam in a radial direction of the specimen by rotating, wherein the light beam is split into the first beam and the second beam by the polarizing beam splitter, and the sensor is a single pixel sensor.

4. The defect inspection device according to claim 1, wherein the sensor includes two sensors.

5. The defect inspection device according to claim 1, wherein the information around the measured point to be measured on the specimen is prior information obtained before measurement.

6. The defect inspection device according to claim 1, wherein the processing processor is further configured to:

obtain a first time average associated with the first beam and a second time average associated with the second beam; and determine the phase correction based on the first time average and the second time average.

7. The defect inspection device according to claim 1, wherein the processing processor is further configured to determine a differential height of a defect based on:

$$\overline{\phi_{dst}} = \arcsin\left(\frac{\overline{I_1} - \overline{I_2}}{\overline{I_1} + \overline{I_2}}\right)$$

$$\Delta h \approx \frac{\lambda}{4\pi}\left(\arcsin\left(\frac{I_1 - I_2}{I_1 + I_2}\right) - \overline{\phi_{dst}}\right),$$

where $\overline{\phi_{dst}}$=the phase correction, $I_1$=a first time value associated with the first beam, $I_2$=a second time value associated with the second beam, and Δh=the differential height of the defect.

8. A defect inspection device using differential interference contrast that inspects a specimen using light, the defect inspection device comprising:

a light source configured to emit a light beam;

a polarizing beam splitter configured to split the light beam into a first beam and a second beam which are polarized and orthogonal to each other;

a sensor configured to detect a signal from the first beam and the second beam reflected from the specimen; and a processing processor configured to process the signal detected by the sensor, the processing processor being configured to:

receive a signal string obtained based on information in at least one dimension around a measured point to be measured on the specimen;

filter the information from the signal string to extract a low-frequency component;

determine a phase correction for the sensor based on the low-frequency component, wherein the phase correction corrects a phase difference between the first beam and the second beam, and interference signals having different polarization are detected using the sensor;

generate corrected interference signals based on the phase correction; and generate shape information on a specimen surface of the specimen by signal processing the corrected interference signals using the low-frequency component; and the defect inspection device further includes a polarizer configured to adjust a polarization angle of a beam input to the sensor based on the phase correction.

9. A defect inspection device using differential interference contrast that inspects a specimen using light, the defect inspection device comprising:

a light source configured to emit a light beam;

a polarizing beam splitter configured to split the light beam into a first beam and a second beam which are polarized and orthogonal to each other;

a sensor configured to detect a signal from the first beam and the second beam reflected from the specimen;

a processing processor configured to process the signal detected by the sensor and determine a phase correction for the sensor, wherein the phase correction corrects a phase difference between the first beam and the second beam, wherein the processing processor is configured to:

receive a signal string obtained based on information in at least one dimension around a measured point to be measured on the specimen;

filter the information from the signal string to extract a low-frequency component;

determine the phase correction for the sensor based on the low-frequency component, wherein the phase correction corrects the phase difference between the first beam and the second beam, and interference signals having different polarization are detected using the sensor;

generate corrected interference signals based on the phase correction; and generate shape information on a specimen surface of the specimen by signal processing the corrected interference signals using the low-frequency component; and a specimen stage on which the specimen is placed, wherein the sensor is a line sensor in which light receiving elements are one-dimensionally arranged at a predetermined pixel pitch, and the specimen stage is driven in a first direction and a second direction, one point on a specimen surface of the specimen is overlapped and scanned at least twice in the first direction, and a scanning pitch in the second direction is a non-integer multiple of a pixel pitch of the sensor.

10. The defect inspection device according to claim 9, wherein the first direction is a circumferential direction of the specimen, and the second direction is a radial direction of the specimen.

11. The defect inspection device according to claim 9, wherein the sensor includes two sensors, the interference signals having different polarization are detected using the two sensors, and the processing processor obtains the shape information on the specimen surface by signal processing.

12. A defect inspection device using differential interference contrast that inspects a specimen using light, the defect inspection device comprising:

a light source configured to emit a light beam;

a polarizing beam splitter configured to split the light beam into a first beam and a second beam which are polarized and orthogonal to each other;

a sensor configured to detect a signal from the first beam and the second beam reflected from the specimen; and a processing processor configured to:

receive a signal string obtained based on information in at least one dimension around a measured point to be measured on the specimen;

filter the information from the signal string to extract a low-frequency component;

determine a phase correction for the sensor based on the low-frequency component, wherein the phase correction corrects a phase difference between the first beam and the second beam, and interference signals having different polarization are detected using the sensor;

generate corrected interference signals based on the phase correction; and generate shape information on a specimen surface of the specimen by signal processing the corrected interference signals using the low-frequency component.

13. The defect inspection device according to claim 12, wherein the sensor includes two sensors, the interference signals having different polarization are detected using the two sensors, and the processing processor obtains the shape information on the specimen surface of the specimen by signal processing.

14. The defect inspection device according to claim 12, further comprising:

a specimen stage on which the specimen is placed, wherein the specimen stage is driven in a circumferential direction of the specimen and in a radial direction of the specimen, one point on the specimen surface is overlapped and scanned at least twice in the circumferential direction of the specimen, and a scanning pitch in the radial direction of the specimen is a non-integer multiple of a pixel pitch of the sensor.

15. The defect inspection device according to claim 13, further comprising:

a beam scanning optical system configured to scan the light beam in a radial direction of the specimen by rotating, wherein the light beam is split into the first beam and the second beam by the polarizing beam splitter, and each of the two sensors is a single pixel sensor.

* * * * *